(12) United States Patent
Chen et al.

(10) Patent No.: US 6,656,778 B1
(45) Date of Patent: Dec. 2, 2003

(54) PASSIVATION STRUCTURE FOR FLASH MEMORY AND METHOD FOR FABRICATING SAME

(75) Inventors: Jung-Chieh Chen, Hsinchu (TW); Tung-Ta Lee, Hsinchu (TW); I-Yueh Chen, Hsinchu (TW); Chen-Chien Lu, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/133,142

(22) Filed: Apr. 26, 2002

(51) Int. Cl.[7] .............................................. H01L 21/00
(52) U.S. Cl. ...................... 438/159; 438/165; 438/278
(58) Field of Search ................................. 257/314, 315, 257/316, 321, 640, 72; 438/257, 595, 258, 972, 159, 165, 278, 637, 185, 201, 210, 211

(56) References Cited

U.S. PATENT DOCUMENTS

| | | | | |
|---|---|---|---|---|
| 5,714,408 A | * | 2/1998 | Ichikawa et al. | 438/761 |
| 6,038,171 A | * | 3/2000 | McElheny | 365/185.14 |
| 6,137,156 A | * | 10/2000 | Ichikawa et al. | 257/640 |
| 6,274,900 B1 | * | 8/2001 | San et al. | 257/314 |
| 6,383,870 B2 | * | 5/2002 | San et al. | 438/257 |
| 6,551,867 B1 | * | 4/2003 | Ozeki et al. | 438/159 |

* cited by examiner

Primary Examiner—Carl Whitehead, Jr.
Assistant Examiner—Laura M Schillinger
(74) Attorney, Agent, or Firm—Martine & Penilla, LLP

(57) ABSTRACT

A passivation structure for a semiconductor device includes a high ultraviolet transmittance silicon nitride (UV-SiN) layer. This UV-SiN layer substantially conformally overlies a plurality of top metal lines, which are formed over a semiconductor substrate, such that topographical hollows are defined between adjacent top metal lines. A spin-on glass (SOG) material fills in the topographical hollows. A silicon oxynitride (SiON) layer having a thickness in a range from about 8,000 angstroms to about 10,000 angstroms overlies the UV-SiN layer and the SOG material. A method for forming the passivation structure also is described.

6 Claims, 2 Drawing Sheets

PASSIVATION STRUCTURE FOR FLASH MEMORY AND METHOD FOR FABRICATING SAME

BACKGROUND OF THE INVENTION

The present invention relates generally to semiconductor fabrication and, more particularly, to a passivation structure for, e.g., flash memory, and a method for fabricating such passivation structure.

In the fabrication of semiconductor devices, passivation layers are used to protect the underlying device components from moisture, contamination, deterioration of electronic properties, and physical damage. The passivation layers are typically formed of silicon nitride or silicon dioxide. These materials prevent mobile ions from entering the device structures and causing problems such as threshold voltage shifting.

In some devices, multiple layer passivation structures are used to relieve stress in the underlying metal and dielectric layers. One known five-layer passivation structure includes a PEOX layer, a high ultraviolet transmittance silicon nitride layer, a spin-on glass (SOG) layer, a layer of silicon oxynitride having a thickness of 6,000 angstroms, and a layer of PSG having a thickness of 9,000 angstroms. One drawback of this structure is that the fabrication process used to form this structure is complicated, time consuming, and expensive. Another drawback of this structure is that the PSG layer, which is formed by plasma enhanced chemical vapor deposition (PECVD), has a granular structure and therefore does not effectively prevent mobile ions from penetrating the PEOX layer.

U.S. Pat. No. 6,261,944 to Mehta et al. discloses a four-layer passivation structure composed of a first PECVD oxide layer, a SOG layer, a second PECVD oxide layer, and a PECVD silicon nitride layer. This passivation structure suffers from the drawbacks that it is complicated and relatively expensive to fabricate and has bad erase characteristics.

U.S. Pat. No. 5,549,786 to Jones et al. discloses a dielectric-SOG-dielectric passivation structure that is composed of a first PECVD silicon nitride layer, a SOG layer, and a second PECVD silicon nitride layer. Unfortunately, this passivation structure does not effectively prevent the underlying device components from moisture, mobile ions, and physical damage.

U.S. Pat. No. 5,483,097 to Ohtsuki et al. discloses a device protecting layer composed of an ultraviolet transmissible silicon nitride film. This silicon nitride film, which is formed by a PECVD process, is relatively thick and therefore induces a large amount of stress. This is undesirable because the induced stress may damage the top metal in a semiconductor device.

In view of the foregoing, there is a need for a passivation structure that not only protects the underlying device components effectively, but also can be fabricated using a method that is quicker and less expensive than conventional methods for forming passivation structures.

SUMMARY OF THE INVENTION

Broadly speaking, the present invention fills this need by providing an effective passivation structure that includes a minimum number of layers. A method for forming this passivation structure also is described.

In accordance with one aspect of the present invention, a passivation structure for a semiconductor device is provided. In this passivation structure, a high ultraviolet transmittance silicon nitride (UV-SiN) layer substantially conformally overlies a plurality of top metal lines, which are formed over a semiconductor substrate, such that portions of a top surface of the UV-SiN layer define a plurality of topographical hollows between adjacent top metal lines. A spin-on glass (SOG) material overlies the portions of the UV-SiN layer that define the plurality of topographical hollows. A silicon oxynitride (SiON) layer overlies the UV-SiN layer and the SOG material.

In one embodiment, the UV-SiN layer has a thickness of about 4,000 angstroms. In one embodiment, the SOG material is a silicate-based material or a siloxane-based material and has a thickness of about 3,400 angstroms. In one embodiment, the SiON layer has a thickness in a range from about 8,000 angstroms to about 10,000 angstroms. In one embodiment, the semiconductor device is a flash memory.

In accordance with another aspect of the present invention, a method for forming a passivation structure for a semiconductor device is provided. In this method, a substrate having a plurality of top metal lines formed thereover is provided. A substantially conformal layer of UV-SiN is formed over the substrate such that portions of a top surface of the UV-SiN layer define a plurality of topographical hollows between adjacent top metal lines. The plurality of topographical hollows is at least partially filled with a SOG material. A layer of SiON is formed over the UV-SiN layer and the SOG material.

The passivation structure of the present invention advantageously provides an enhanced passivation effect using a minimum number of layers. The relatively thick SiON layer not only protects the underlying features from moisture, but also prevents alkali metal ions from penetrating therethrough. In addition, the SiON layer protects the SOG material during subsequent wet etching processes. By virtue of user fewer layers than are used in conventional passivation structures, the method for forming a passivation structure of the present invention is shorter and less expensive than the methods used to form conventional passivation structures.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF EXEMPLARY EMBODIMENTS

Several exemplary embodiments of the invention will now be described in detail with reference to the accompanying drawings.

Figure 1:
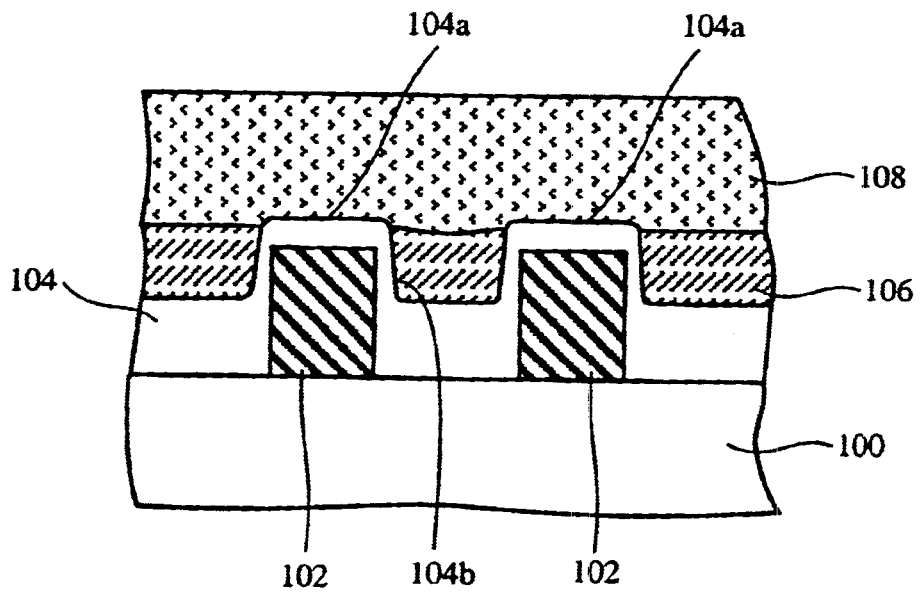
FIG. 1 is a cross-sectional view of a passivation structure in accordance with one embodiment of the present invention.

FIG. 1 is a cross-sectional view of a passivation structure in accordance with one embodiment of the present invention. As shown in FIG. 1, semiconductor substrate 100 has top metal lines 102 formed thereon. High ultraviolet transmittance silicon nitride ($SiN_xH_y$) layer 104 (hereafter UV-SiN layer 104) conformally covers top metal lines 102. Portions 104a of the top surface of UV-SiN layer 104 overlie the top surfaces of top metal lines 102. Portions 104b of the top surface of UV-SiN layer define topographic hollows between adjacent top metal lines 102. Spin-on glass (SOG) material 106 fills in the topographical hollows defined between adjacent top metal lines 102 by portions 104b of the top surface of UV-SiN layer 104. Silicon oxynitride (SiON) layer 108 covers UV-SiN layer 104 and spin-on glass material 106.

Figure 2A:
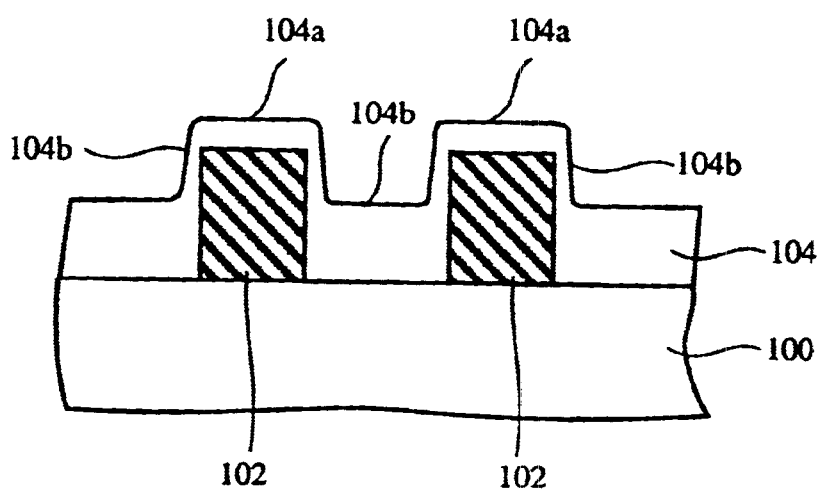
FIGS. 2A–2C illustrate an exemplary method for fabricating the passivation structure shown in FIG. 1.
Figure 2B:
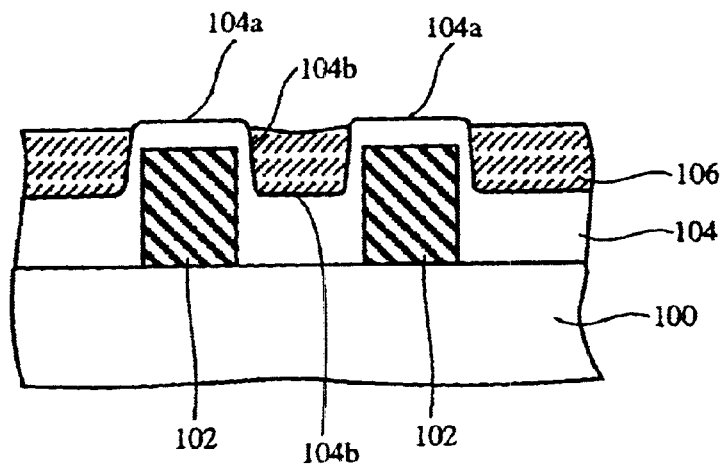
Figure 2C:
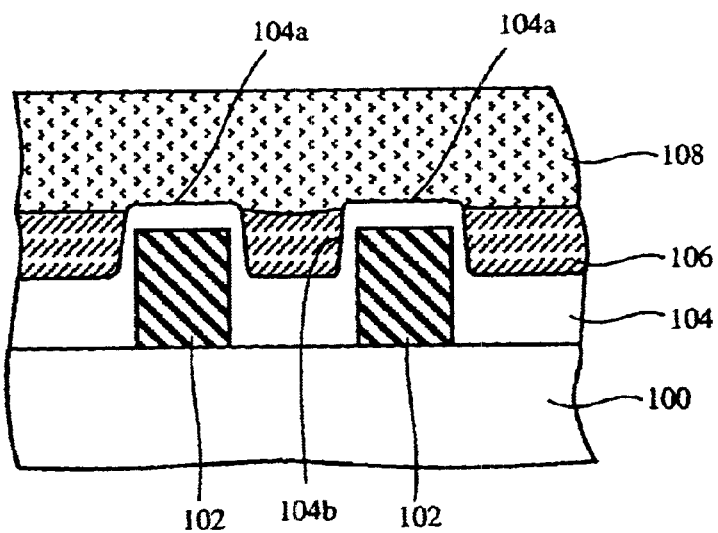

FIGS. 2A–2C illustrate an exemplary method for fabricating the passivation structure shown in FIG. 1. With reference to FIG. 2A, semiconductor substrate 100 has top metal lines 102 formed thereover. In one embodiment, semiconductor substrate 100 is a silicon substrate that has undergone additional processing operations associated with the fabrication of a flash memory. Top metal lines 102 may be formed by forming a metal layer over semiconductor substrate 100 and patterning the metal layer in accordance with well-known fabrication techniques. For ease of illustration, only two top metal lines 102 are shown in FIG. 2A. Those skilled in the art will appreciate that semiconductor devices typically include numerous top metal lines beyond those shown in FIG. 2A.

In accordance with the invention, UV-SiN layer 104 is formed over top metal lines 102. UV-SIN layer may be formed by any suitable technique, e.g., plasma-enhanced chemical vapor deposition (PECVD). As shown in FIG. 2A, UV-SiN layer 104 conformally covers top metal lines such that portions 104a of the top surface of the UV-SiN layer overlie the top surfaces of top metal lines 102 and portions 104b define topographical hollows between adjacent top metal lines. In one embodiment, UV-SiN layer has a thickness of about 4,000 angstroms. As used herein, the term "about" means that the specified dimension may be varied within an acceptable manufacturing tolerance for a given application. In one embodiment, the acceptable manufacturing tolerance is ±10%.

Next, as shown in FIG. 2B, SOG material 106 is applied to semiconductor substrate 100 to at least partially fill in the topographical hollows defined between adjacent metal lines 102. SOG material 106 may be applied using any suitable technique, e.g., spin coating. One function of SOG material 106 is to smooth out the underlying features. In one embodiment, SOG material 106 fills in the topographical hollows such that, in each topographic hollow, portion 104b of the top surface of UV-SiN layer 104 is substantially covered with spin-on glass material. When SOG material 106 substantially covers portion 104b of the top surface of UV-SiN layer 104 in each topographic hollow, the height of the top surface of the SOG material is approximately the same as the height of the top surface of portion 104a of the UV-SiN layer. In this manner, the top surfaces of SOG material 106 and the top surfaces of portions 104a of UV-SiN layer 104 define a relatively smooth surface. By way of example, suitable SOG materials include conventional silicate-based materials and siloxane-based materials. In one embodiment, SOG material 106 has a thickness of about 3,400 angstroms. In this embodiment, the acceptable manufacturing tolerance is ±10%.

Turning to FIG. 2C, after SOG material 106 is applied, SiON layer 108 is formed over SOG material 106 and UV-SiN layer 104. By way of example, SiON layer 108 may be formed through the nitridation of silicon oxide in accordance with well-known techniques. In one embodiment, SiON layer 108 has a thickness in a range from about 8,000 angstroms to about 10,000 angstroms. In this embodiment, the acceptable manufacturing tolerance is ±10%. As shown in FIG. 2C, the top surface of SiON layer 108 is relatively smooth, i.e., substantially planarized. This relatively smooth top surface results due to the combination of the underlying surface on which SiON layer 108 is formed being relatively smooth and the SiON layer being relatively thick.

The passivation structure of the present invention advantageously provides an enhanced passivation effect using a minimum number of layers. The relatively thick SiON layer not only protects the underlying features from moisture, but also prevents alkali metal ions from penetrating therethrough. In addition, the SiON layer protects the SOG material during subsequent wet etching processes. By virtue of user fewer layers than are used in conventional passivation structures, the method for forming a passivation structure of the present invention is shorter and less expensive than the methods used to form conventional passivation structures.

In summary, the present invention provides a passivation structure for, e.g., flash memory, and a method for forming such passivation structure. The invention has been described herein in terms of several exemplary embodiments. Other embodiments of the invention will be apparent to those skilled in the art from consideration of the specification and practice of the invention. The embodiments and preferred features described above should be considered exemplary, with the scope of the invention being defined by the appended claims and their equivalents.

What is claimed is:

1. A passivation structure for a semiconductor device, comprising:
   a plurality of top metal lines overlying a substrate;
   a high ultraviolet transmittance silicon nitride layer substantially conformally overlying the plurality of top metal lines such that portions of a top surface of the high ultraviolet transmittance silicon nitride layer define a plurality of topographical hollows between adjacent top metal lines;
   a spin-on glass material overlying the portions of the high ultraviolet transmittance silicon nitride layer that define the plurality of topographical hollows; and
   a silicon oxynitride layer overlying the high ultraviolet transmittance silicon nitride layer and the spin-on glass material.

2. The passivation structure of claim 1, wherein the high ultraviolet transmittance silicon nitride layer has a thickness of about 4,000 angstroms.

3. The passivation structure of claim 1, wherein the spin-on glass material has a thickness of about 3,400 angstroms.

4. The passivation structure of claim 1, wherein the silicon oxynitride layer has a thickness in a range from about 8,000 angstroms to about 10,000 angstroms.

5. The passivation structure of claim 1, wherein the spin-on glass material is a material selected from the group consisting of silicate-based materials and siloxane-based materials.

6. The passivation structure of claim 1, wherein the semiconductor device is a flash memory.

* * * * *